(12) United States Patent
Hess et al.

(10) Patent No.: US 9,236,100 B1
(45) Date of Patent: Jan. 12, 2016

(54) DYNAMIC GLOBAL MEMORY BIT LINE USAGE AS STORAGE NODE

(71) Applicant: Apple Inc., Cupertino, CA (US)

(72) Inventors: Greg M. Hess, Mountain View, CA (US); Ramesh Arvapalli, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/497,566

(22) Filed: Sep. 26, 2014

(51) Int. Cl.
*G11C 7/10* (2006.01)
*G11C 7/12* (2006.01)
*G11C 7/22* (2006.01)

(52) U.S. Cl.
CPC ............... *G11C 7/12* (2013.01); *G11C 7/1006* (2013.01); *G11C 7/1012* (2013.01); *G11C 7/1048* (2013.01); *G11C 7/1051* (2013.01); *G11C 7/22* (2013.01)

(58) Field of Classification Search
CPC .. G11C 7/1006; G11C 7/1009; G11C 7/1012; G11C 7/1048; G11C 7/1051
USPC ....................................... 365/189.02, 189.04
See application file for complete search history.

(56) References Cited

U.S. PATENT DOCUMENTS

| | | | |
|---|---|---|---|
| 6,438,063 B1 | 8/2002 | Lee | |
| 7,525,850 B2 | 4/2009 | Chae et al. | |
| 8,289,795 B1 | 10/2012 | Hsu | |
| 2006/0050314 A1* | 3/2006 | Shiga | G11C 16/102 358/1.16 |
| 2009/0323445 A1* | 12/2009 | Adams | G11C 29/1201 365/201 |
| 2011/0141788 A1* | 6/2011 | Balakrishnan | B82Y 10/00 365/51 |
| 2013/0155770 A1 | 6/2013 | Hirano | |
| 2015/0117104 A1* | 4/2015 | Senoo | G11C 7/1039 365/185.12 |

* cited by examiner

*Primary Examiner* — Hoai V Ho
*Assistant Examiner* — Jay Radke
(74) *Attorney, Agent, or Firm* — Meyertons, Hood, Kivlin, Kowert & Goetzel, P.C.

(57) ABSTRACT

An apparatus, system, and method are contemplated in which the apparatus may include a memory with a plurality of pages, circuitry, and a plurality of pre-charge circuits. The circuitry may be configured to receive a first read command and address, corresponding to a given page. The plurality of pre-charge circuits may be configured to charge a plurality of data lines to a predetermined voltage. The circuitry may be configured to read data values from the memory, and transfer the data values to the plurality of data lines. The plurality of pre-charge circuits may be configured to maintain the data on the plurality of data lines. The circuitry may select a first subset of the maintained data, receive a second read command and a second address by the memory, and select a second subset of the maintained data responsive to a determination that the second address corresponds to the given page.

20 Claims, 9 Drawing Sheets

DYNAMIC GLOBAL MEMORY BIT LINE USAGE AS STORAGE NODE

BACKGROUND

1. Technical Field

Embodiments described herein are related to the field of integrated circuit implementation, and more particularly to the implementation of memories.

2. Description of the Related Art

Computing systems may include one or more systems on a chip (SoC), which may integrate a number of different functions, such as, graphics processing, onto a single integrated circuit. With numerous functions included in a single integrated circuit, chip count may be kept low in mobile computing systems, such as tablets, for example, which may result in a smaller form factor for such mobile computing systems.

Memories, such as those included in SoC designs, typically include a number of data storage cells arranged in an array, and composed of transistors fabricated on a semiconductor substrate. Such data storage cells may be constructed according to a number of different circuit design styles. For example, the data storage cells may be implemented as a single transistor coupled to a capacitor to form a dynamic storage cell. Alternatively, cross-coupled inverters may be employed to form a static storage cell, or a floating gate metal-oxide semiconductor field-effect transistor (MOSFET) may be used to create a non-volatile memory.

One method for reading data from a memory array includes using a plurality of data lines, each coupled to one or more sense amplifiers (also referred to as "sense amps"). The data lines may be pre-charged to a known logic level, such as a logic 1, after which, the sense amps may detect a logic level, such as a logic 0, in a selected memory cell and pull the corresponding pre-charged data line to the logic 0 level. After the data lines have been read, they may be pre-charged again in preparation for the next read operation.

The pre-charging and detection of data values in a memory array may be a source of undesired power consumption. A method of reducing the power consumption associated with reading memory cells is desired.

SUMMARY OF THE EMBODIMENTS

Various embodiments of a memory are disclosed. Broadly speaking, an apparatus, a system, and a method are contemplated in which the apparatus may include a memory with a plurality of pages, circuitry, and a plurality of pre-charge circuits. The circuitry may be configured to receive a first read command and address, corresponding to a given page. Each pre-charge circuit of the plurality of pre-charge circuits may be configured to charge a respective data line of a plurality of data lines to a predetermined voltage. The circuitry may also be configured to read data values from the memory, and transfer the data values to the plurality of data lines. The plurality of pre-charge circuits may be further configured to maintain the data on the plurality of data lines. The circuitry may be further configured to select, for output, a first subset of the maintained data, receive a second read command and a second address, and select, for output, a second subset of the maintained data responsive to a determination that the second address corresponds to the given page. The first subset and the second subset may be different.

In another embodiment, each pre-charge circuit of the plurality of pre-charge circuits may be configured to charge the respective data line of the plurality of data lines responsive to a first clock transition of a received clock signal. In a further embodiment, the circuitry may be further configured to transfer the data values to the plurality of data lines responsive to a second clock transition of the received clock signal.

In another embodiment, the apparatus may also include a multiplex unit configured to generate a first output value dependent on the first subset of the maintained data. In a further embodiment, the multiplex unit may be further configured to generate a second output value dependent upon the second subset of the maintained data. In one embodiment, the first subset and the second subset of the maintained data may be selected dependent upon an output of a branch prediction unit.

In another embodiment, each pre-charge circuit of the plurality of pre-charge circuits may be further configured to charge the respective data line of the plurality of data lines responsive to an activation of a plurality of charge enable signals dependent upon the first address. The circuitry may be further configured to transfer the data values to the plurality of data lines responsive to an activation of a plurality of read enable signals.

BRIEF DESCRIPTION OF THE DRAWINGS

The following detailed description makes reference to the accompanying drawings, which are now briefly described.

FIG. 5 which includes FIGS. 5(A) and 5(B), illustrates block diagrams of another embodiment of a data selection operation in a memory system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

As computing system continue to evolve, power consumption has become an important factor in the design of such systems. Power consumption is of particular concern in mobile computing systems. In some mobile computing systems, power may be managed on a chip-by-chip basis and, in some cases, to a granularity of functional blocks within a given chip, to extend battery life.

Memories, which may be used to store data, program instructions, and the like, may be of particular concern when managing power consumption of a computing system. Memories may consume power during read operations. Data lines coupled to a memory array's sense amplifiers (also referred to herein as "sense amps") may be pre-charged to a known logic level, such as a logic 1, after which, the sense amps may detect a logic level, such as a logic 0, in a selected memory cell and pull the corresponding pre-charged data line to the logic 0 level. After the data lines have been read, they may be pre-charged again in preparation for the next read operation. This pre-charging and detection of data values in a memory array may be a source of undesired power consumption.

A method of reducing the power consumption associated with reading memory cells is desired. Embodiments described herein may present methods for limiting the pre-charging of data lines to conserve power in a memory.

Many terms commonly used in reference to SoC designs are used in this disclosure. For the sake of clarity, the intended definitions of some of these terms, unless stated otherwise, are as follows:

A Metal-Oxide-Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an re-channel transistor on, i.e., opens a conductive path, and turns a p-channel MOSFET off, i.e., closes a conductive path. Conversely, a low level on the gate of a MOS-FET turns a p-channel on and an n-channel off. While CMOS logic is used in the examples described herein, it is noted that any suitable logic process may be used for the circuits described in embodiments described herein.

It is noted that "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

System-on-a-Chip Overview

Figure 1:
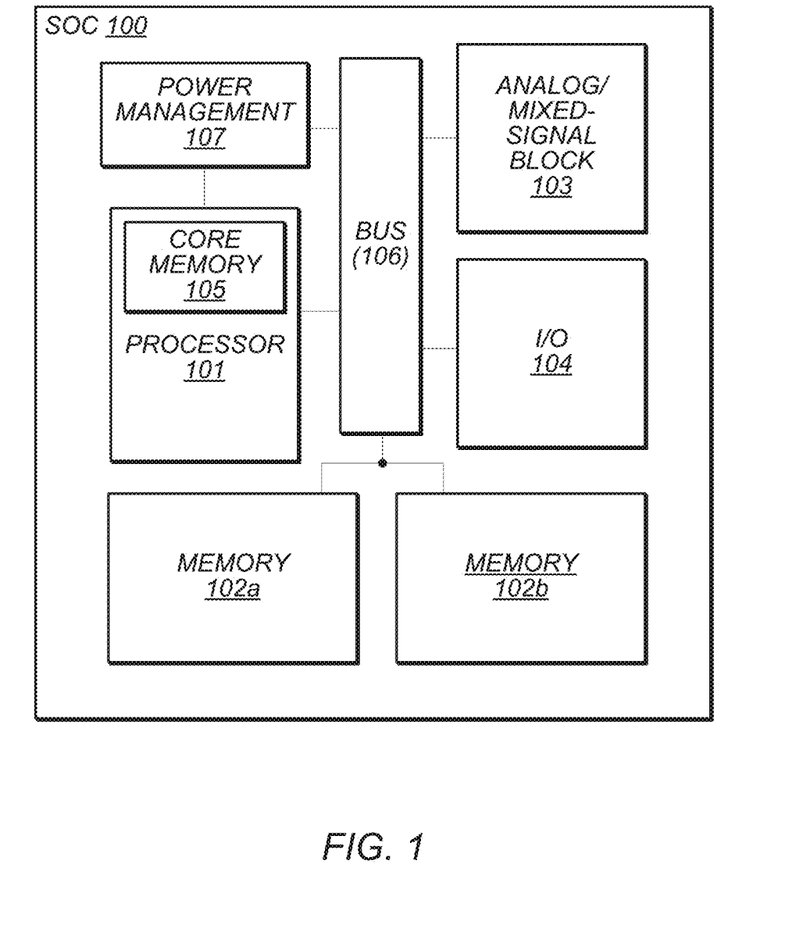
FIG. 1 illustrates a block diagram of an embodiment of a system-on-a-chip.

A block diagram of an SoC is illustrated in FIG. 1. In the illustrated embodiment, the SoC 100 includes a processor 101 coupled to memory blocks 102a and 102b, an analog/mixed-signal block 103, an I/O block 104, and a power management unit 107, through a system bus 106. Processor 101 is also coupled directly to a core memory 105. In various embodiments, SoC 100 may be configured for use in various mobile computing applications such as, e.g., tablet computers, smart-phones, or wearable devices.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include multiple CPU cores. In various embodiments, processor 101 may include one or more register files and/or memories.

In various embodiments, processor 101 may implement any suitable instruction set architecture (ISA), such as, e.g., PowerPC™, or x86 ISAs, or combination thereof. Processor 101 may include one or more bus transceiver units that allow processor 101 to communicate to other functional blocks within SoC 100 such as, memory blocks 102a and 102b, for example.

Memory 102a and memory 102b may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM), for example. Some embodiments may include a single memory, such as memory 102a and other embodiments may include more than two memory blocks (not shown). Memory 102a and memory 102b may be multiple instantiations of the same type of memory or may be a mix of different types of memory. In some embodiments, memory 102a and memory 102b may be configured to store program instructions that may be executed by processor 101. Memory 102a and memory 102b may, in other embodiments, be configured to store data to be processed, such as graphics data for example.

Analog/mixed-signal block 103 may include a variety of circuits including, for example, an analog-to-digital converter (ADC) and a digital-to-analog converter (DAC) (neither shown). One or more clock sources may also be included in analog/mixed signal block 103, such as a crystal oscillator, a phase-locked loop (PLL) or delay-locked loop (DLL). In some embodiments, analog/mixed-signal block 103 may also include radio frequency (RF) circuits that may be configured for operation with cellular or other wireless networks. Analog/mixed-signal block 103 may include one or more voltage regulators to supply one or more voltages to various functional blocks and circuits within those blocks.

I/O block 104 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 104 may be configured to implement a version of Universal Serial Bus (USB) protocol, or IEEE 1394 (Firewire®) protocol, and may allow for program code and/or program instructions to be transferred from a peripheral storage device for execution by processor 101. In one embodiment, I/O block 104 may be configured to perform the data processing necessary to implement an Ethernet (IEEE 802.3) networking standard.

Core memory 105 may, in some embodiments, be configured to store frequently used instructions and data for the processor 101. In other embodiments, core memory 105 may be part of an instruction and/or data queue for one or more processing cores in processor 101. Core memory 105 may comprise SRAM, DRAM, register files or any other suitable type of memory. In some embodiments, core memory 105 may include a combination of memory types in multiple memory arrays. Core memory 105 may be a part of a processor core complex (i.e., part of a cluster of processors) as part of processor 101 or, in other embodiments, it may be a separate functional block from processor 101.

System bus 106 may be configured as one or more buses to couple processor 101 to the other functional blocks within the SoC 100 such as, e.g., memory 102a, and I/O block 104. In some embodiments, system bus 106 may include interfaces coupled to one or more of the functional blocks that allow a particular functional block to communicate through the link. In some embodiments, system bus 106 may allow movement of data and transactions between functional blocks without intervention from processor 101. For example, data received through the I/O block 104 may be stored directly to memory 102a.

Power management unit 107 may be configured to manage power delivery to some or all of the functional blocks included in SoC 100. Power management unit 107 may include sub-blocks for managing multiple power supplies for various functional blocks. In various embodiments, the power supplies may be located in analog/mixed-signal block 103, in power management unit 107, in other blocks within SoC 100, or come from external to SoC 100, coupled through power supply pins. Power management unit 107 may receive signals that indicate the operational state of one or more functional blocks. In response to the operational state of a functional block, power management unit may adjust an output of a power supply. Power management unit 107 may also receive one or mode clock signals for use in managing and adjusting an output of a power supply.

It is noted that the SoC illustrated in FIG. 1 is merely an example. In other embodiments, different functional blocks and different configurations of functions blocks may be possible dependent upon the specific application for which the SoC is intended. It is further noted that the various functional blocks illustrated in SoC 100 may operate at different clock frequencies, and may require different power supply voltage levels.

Figure 2:
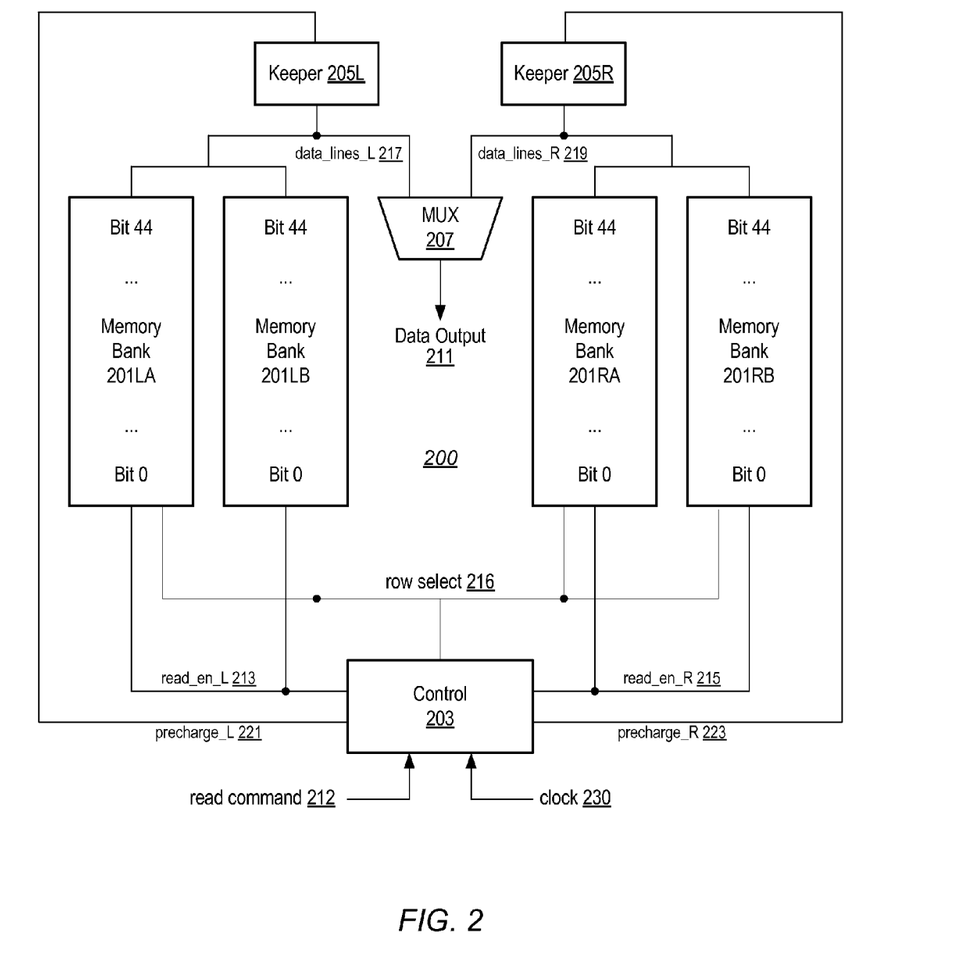
FIG. 2 illustrates a block diagram of an embodiment of a memory system.

Turning to FIG. 2, an embodiment of a memory system is illustrated. FIG. 2 illustrates a memory according to one possible embodiment and may be included in an SoC such as, e.g., SoC 100 as illustrated in FIG. 1. In various embodiments, memory 200 may correspond to one of memory 102a, memory 102b, or core memory 105. In the illustrated embodiment, memory 200 includes memory banks 201LA, 201LB, 201RA and 201RB, control circuitry 203, left-side keeper circuits (keeper) 205L, right-side keeper circuits (keeper) 205R and multiplexing unit (MUX) 207.

Memory banks 201 may each include a plurality of memory cells. Memory banks 201 may correspond to memory included in memory blocks 102 or core memory 105 in FIG. 1, or may correspond to various other types of memory included in other functional blocks of SoC 100 in FIG. 1, such as, for example, register files or data buffers in I/O block 103. Memory banks 201 may consist of any suitable type of memory cells as described above in respect to memory block 102. In some embodiments, memory banks 201 may be organized into left-side memory banks, (201LA, 201LB) and right-side memory banks (210RA and 201RB). Memory 200 may be designed such that, in response to a single read command, data is read from a selected location in the left-side memory banks, 201LA and 201LB, and a corresponding location in the right-side memory banks, 201RA and 201RB, in parallel, such that a data value returned in response to the read command may include bits from both the left-side and right-side memory banks 201. Memory banks 201 may be organized in various different configurations, such as, for example, upper and lower memory banks or with a single memory bank providing data to all data lines.

It is noted that the term "parallel" as used herein, refers to two or more actions occurring within a same time period, i.e., concurrently, such as one or more cycles of an associated clock signal, such as, e.g., clock signal 230. The term "parallel" is not intended to imply the two or more actions occur at precisely the same time.

Control circuitry 203 may receive memory access commands, such as read command 212, from a processor in SoC 100, such as, for example, processor 101 or a core or coprocessor within processor 101. In other embodiments, control circuitry 203 may receive commands from one or more other functional blocks in SoC 100. Clock signal 230 may also be received and used by control circuitry 203 for synchronizing operations included in executing a read command. Control circuitry 203 may, in some embodiments, include address decoding logic to determine which memory bank and which locations in the determined memory bank (or banks) are targeted in a received command. In response to a received read command 212, control 203 may decode an address and select a corresponding memory bank, or banks, using read_en_L 213 and read_en_R 215. Control 203 may also select a corresponding row of the selected memory bank (or banks) using row select 216.

Each memory bank 201 may be designed to return a fixed number of data bits in response to a read command. In some embodiments, the number of data bits read from a memory bank 201 may correspond to one row of memory in each memory bank 201. In the illustrated embodiment, each memory bank 201 may read 45 bit values in response to a single read command, although any suitable number of bits is contemplated for various embodiments. The 45 bit values may be read out through 45 data lines coupled to each memory bank 201. Data_lines_L 217 may be coupled to memory banks 201LA and 201LB and data_lines_R 219 may be coupled to memory banks 201RA and 201RB. Data_lines_L 217 and data_lines_R 219 may be coupled to keeper 205L and keeper 205R respectively. The total data read out to data_lines_L 217 and data_lines_R 219 may be referred to as a page of data. As used herein, a "page" of data may refer collectively to all data bits read from the accessed memory banks 201 in response to a single read operation.

Data may be stored in memory 200 in segment sizes referred to as "data words" or simply "words." A data word may refer to a number of bits associated with a single data value. For example, some data words may be one byte long (i.e., eight bits). Other data words may be 16 bits or 32 bits. In some embodiments, data words stored in memory banks 201 may be of a bit length equal to the number of bits in a page of memory. In other words, a size of the data word may match the number of data lines coupled to memory banks 201. In various other embodiments, a data word size may be smaller or larger than the memory bank interface size. In the illustrated embodiment, a data word may be five bits long, in comparison to the 45 data_lines_L 217 or 45 data_lines_R 219 coupled to each memory bank. Therefore, each memory bank 201 may read nine data words per read command 212, for a total of 18 words read from the right-side and left-side memory banks 201 combined.

Keepers 205L and 205R may include multiple keeper circuits, and each keeper circuit may be coupled to a corresponding data line from memory banks 201. In the left-right memory organization shown in FIG. 2, keeper 205L may be coupled to data_lines_L 217 from left-side memory banks 201LA and 201LB, while keeper 205R may be similarly coupled to data_lines_R 219 from right-side memory banks 201RA and 201RB. Keeper circuits such as included in keepers 205L and 205R, may be used to pre-charge each data line in preparation for a read operation in response to precharge_L 221 and precharge_R 223 signals being asserted. These keeper circuits may also latch a data value from a memory cell coupled the corresponding data line in response to an de-assertion of precharge_L 221 and precharge_R 223 signals from control circuitry 203.

Data latched by keepers 205L and 205R may be received by MUX 207. MUX 207 may receive selection signals and use these selection signals to select a subset of the 18 data words of the example to form data output 211. In the embodiment of FIG. 2, eight data words may be selected as data output 211. It is contemplated that, in various embodiments, any number of the 18 data words in the example memory 200 may be selected. In some embodiments, MUX 207 may, for each data bit 0 through 44, select between a data bit from data_lines_L 217 and a corresponding data bit from data_lines_R 219. In other words, bit 10 of data_output 211 may come from bit 10 of data_lines_L 217 while bit 11 may come from bit 11 of data_lines_R 219. In other embodiments, any subset of data bits from data_lines_L 217 and data_lines_R 219 may be selected. MUX 207 may receive selection signals from control 203, dependent upon the received read command 212, or MUX 207 may receive selection signals direct from a processor that generated read command 212.

In some embodiments, MUX 207 may consist of one or more multiplexing circuits designed for selecting the subset of data words. In other embodiments, suitable circuits other than general purpose multiplexing circuits may be used, such as, for example, pipelined multiplexors or shift registers.

It is noted that the embodiment of memory 200 as illustrated in FIG. 2 is merely an example. The numbers and types of functional blocks may differ in various embodiments. For example, in other embodiments, more than four memory banks may be included and a different number of bits may be read from a given bank in response to a read command.

Figure 3:
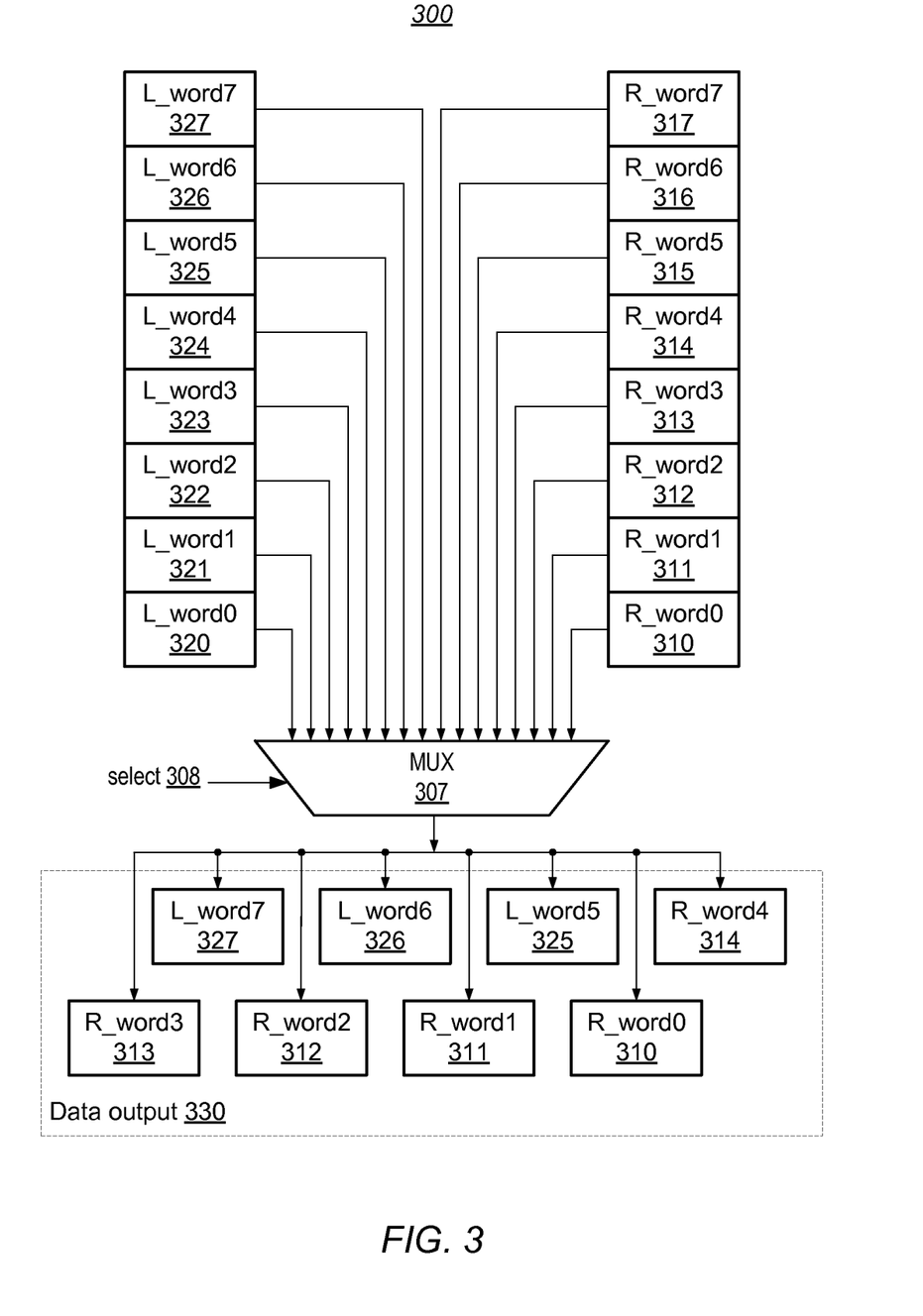
FIG. 3 illustrates a block diagram of an embodiment of a data selection operation in a memory system.

Moving to FIG. 3, an embodiment of a data selection operation is illustrated. The data selection operation of FIG. 3 may be applied to a memory system, such as, for example, memory 200 of FIG. 2. The illustrated embodiment of data selection operation 300 may include multiplexor unit (MUX) 307 which may correspond to MUX 207 in FIG. 2. MUX 307 may receive data words R_word0 310 through R_word7 317, from data_lines_R 219, and receive data words L_word0 320 through L_word7 327, from data_lines_L 217. MUX 307 may output a selected subset of the received data words 330-337 as data output 340.

In response to a read command, such as, for example, read command 212 described in FIG. 2, data words R_word0 310 through R_word7 317 may be read from right-side memory banks (210RA and 201RB). In parallel, data words L_word0 320 through L_word7 327 may be read from left-side memory banks, (201LA, 201LB). In the description of FIG. 2, each memory bank 201 was stated as returning 45 bits, or nine 5-bit data words in response to a read command. In other embodiments, each data word may correspond to a single bit and MUX 307 may select a subset of the bits to form a single multi-bit word for data output 330.

In some embodiments, all data words may contain similar data, while in other embodiments, one or more data words may be used to hold data of a different type than other data words, e.g., metadata. Metadata may include, for example, error correction data, time stamps, order of arrival information, or any other suitable data corresponding to the other data words. In the present example, eight of the nine data words from each of data_lines_R 219 and data_lines_L 217 may be used from which to select the data words for data output 330, while the ninth word may include metadata related to the other eight words.

MUX 307 may receive input signals select 308, either from control circuitry 203 or from a processor in SoC 100 that may have initiated read command 212. Depending on select 308, MUX 307 may select a subset of data words R_word0 310 through R_word7 317 and L_word0 320 through L_word7 327 to generate data output 330. In the illustrated example operation, data output 330 may include data words R_word0 310 through R_word4 314 and L_word5 325 through L_word7 327. In other example read operations, any suitable combination of the received words may be selected as data output 330. Data output 330 may be used as a response to read command 212 by memory 200.

It is noted that the embodiment illustrated in FIG. 3 is merely an example. In other embodiments, a different number of data words may be received by MUX 307 and a different number of data words may be included in data output 330. Although FIG. 3 shows an equal number of data words received from data_lines_R 219 and data_lines_L 217, memory 200 may be designed such that a different number of data words are received from each set of data lines.

In the embodiments of FIG. 2 and FIG. 3, after MUX 307 (or MUX 207) has generated data output 330 (or data output 211), data_lines_R 219 and data_lines_L 217 may be pre-charged by keepers 205R and 205L, respectively, in preparation for a next read command, before the next read command is received. This pre-charging by keepers 205 may overwrite the data words that have been read in response to read command 212.

Figure 4:
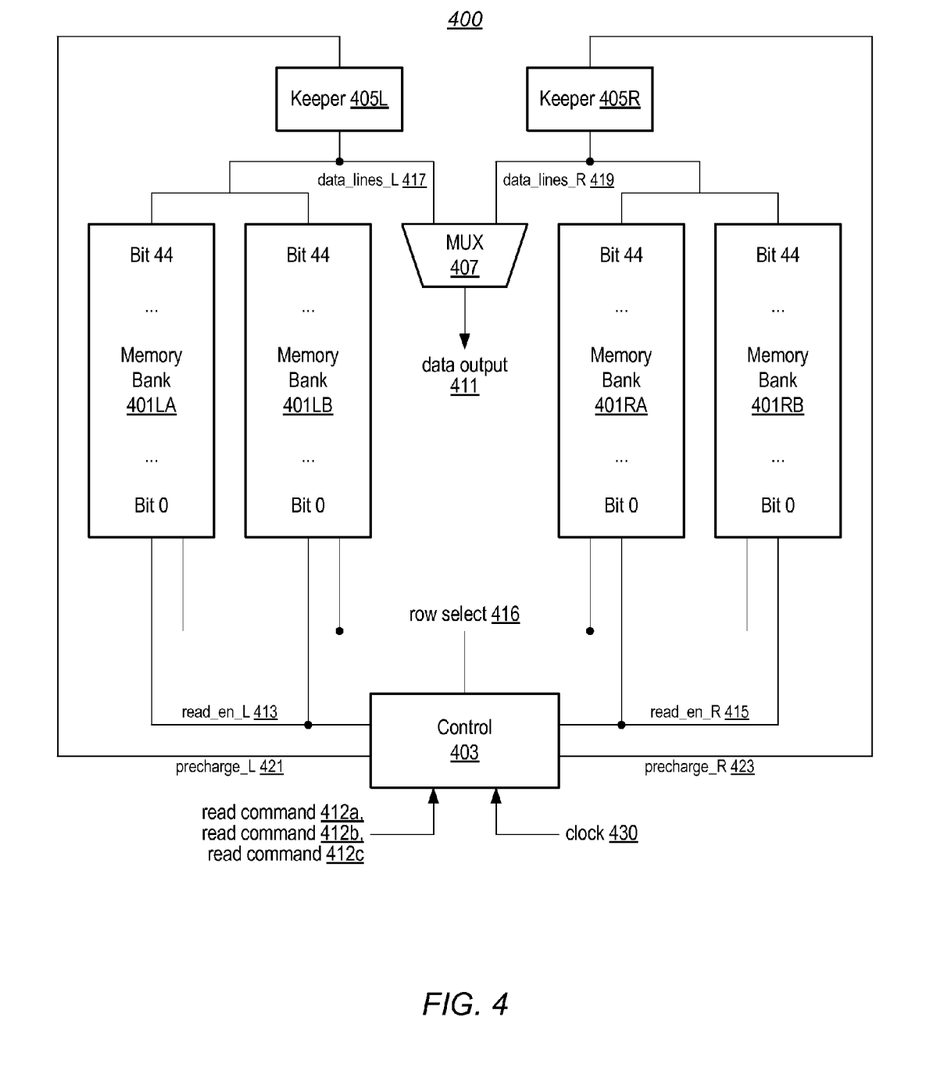
FIG. 4 illustrates a block diagram of another embodiment of a memory system.

Moving now to FIG. 4, another embodiment of a memory system is illustrated. Memory 400 of FIG. 4 may be similar to memory 200 in FIG. 2, and may be included in an SoC such as, e.g., SoC 100 as illustrated in FIG. 1. Memory 400 may correspond to one of memory 102a, memory 102b, or core memory 105, in various embodiments. In the illustrated embodiment, memory 400 includes memory banks 401LA, 401LB, 401RA and 401RB, control circuitry 403, left-side keeper circuits (keeper) 405L, right-side keeper circuits (keeper) 405R and multiplexing unit (MUX) 407. Operation of the components of memory 400 may correspond to the descriptions provided for similar components of memory 200 in FIG. 2, with exceptions noted below.

In the description of memory 200, it was noted that data read out onto data_lines_L 217 and data_lines_R 219 in response to read command 212 may be overwritten when keepers 205L and 205R pre-charge data_lines_L 217 and data_lines_R 219 in preparation for a next read command, before the next read command is received. Memory 400 may include additional features such that pre-charging of data_lines_L 417 and data_lines_R 419 may not occur until after a next read command is received. Control circuitry 403 may include additional circuitry to delay asserting precharge_L 421 and precharge_R 423 until after a read command, such as read command 412a has been received.

By delaying the pre-charging of the data_lines, data_lines_L 417 and data_lines_R 419 may not be pre-charged upon completing a response to a first read command, such as, for example, read command 412a. Instead, when a next read command is received, for example, read command 412b, an address of the read command may be decoded. If the address of read command 412b corresponds to the same memory page of the previously executed read command 412a, then precharge_L 421 and precharge_R 423 may not be asserted and data previously latched by keepers 405L and 405R in response to read command 412a may be retained and used again for read command 412b. Selection signals for MUX 407 may be different than for read command 412a, resulting in a different value for data output 411. This operation of MUX 407 will be discussed in more detail in regards to FIG. 5 below. Once read command 412b has been executed, control circuitry 403 may receive another read command, such as read command 412c for example. If an address of read command 412c does not correspond to the same memory page as read command 412b, then precharge_L 421 and precharge_R 423 may assert. Data_lines_L 417 and data_lines_R 419 may be pre-charged in response to the assertion of precharge_L 421 and precharge_R 423 and data may then be read from the memory banks and rows corresponding to the addressed page.

It is noted that FIG. 4 is merely an example for the purpose of illustrating the disclosed concepts. The numbers and types of functional blocks may differ in various embodiments. For example, in other embodiments, a number of memory banks other than four may be included and the included memory banks may be arranged in a configuration other than left-side banks and right-side banks.

Figure 5:
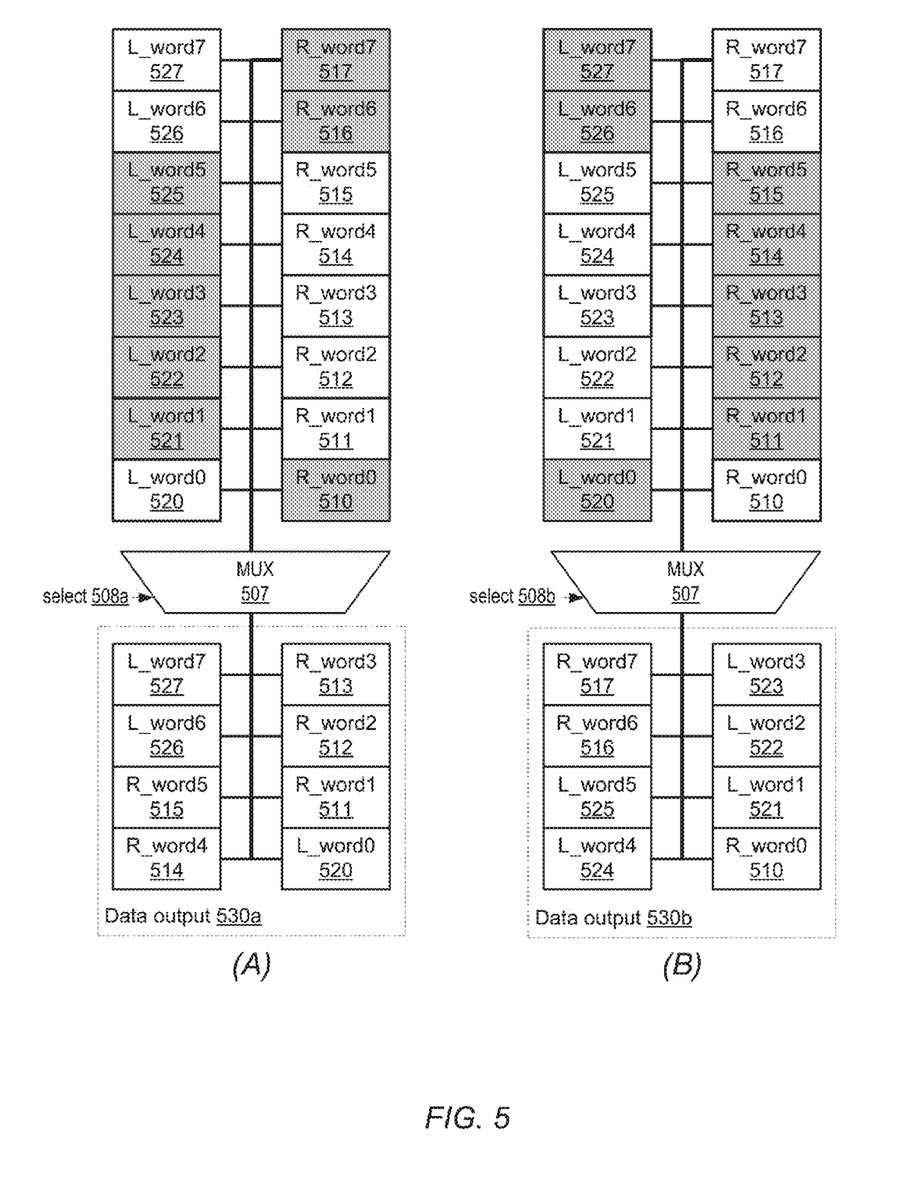

Turning now to FIG. 5, which includes FIG. 5(A) and FIG. 5(B), two embodiments of data selection operations are illustrated. The data selection operation of FIG. 5(A) may correspond to read command 412a and the data selection operation of FIG. 5(B) may correspond to read command 412b as executed by memory 400 in FIG. 4.

In FIG. 5(A), read command 412a may result in data words L_word0 520 through L_word7 527 being read onto data_lines_L 417 and data words R_word0 510 through R_word7 517 being read onto data_lines_R 419. Select 508a may correspond to an address included in read command 412a and may result in MUX 507 selecting eight of the 16 words from data_lines_L 417 and data_lines_R 419 as data output 530a. Data output 530a may include data words R_word1 511 through R_word5 515, L_word0 520, L_word6 526, and L_word7 527.

In FIG. 5(B), read command 412b may be a next read command received by memory 400. In this example, read command 412b may include an address that corresponds to the same memory page as read command 412a. Precharge_L 421 and precharge_R 423 may remain de-asserted as a result and keepers 405L and 405R may retain the data read in response to read command 412a. Select 508b, however, may be different than select 508a, resulting in MUX 507 selecting different data words as data output 530b. In this example, data output 530b may include data words R_word0 510, R_word6 516, R_word7 517, and L_word1 521 through L_word5 525.

Since precharge_L 421 and precharge_R 423 remained de-asserted in this example, power was not spent pre-charging data_lines_L 417 and data_lines_R 419 and re-reading the same data values that were previously read. It is noted that while no overlap occurred between the data words included in data output 530a and data output 530b in this example, in other embodiments of read operations, a same one or more data words may be included in successive data output values.

The embodiments of FIG. 5 are merely examples for demonstration. Other embodiments may include a different number of data words received and/or a different number of data words output. As was described above, each data word shown in FIGS. 5(A) and 5(B) may correspond to a single bit and data outputs 530 may consist of a single data value including the selected bits.

Figure 6:
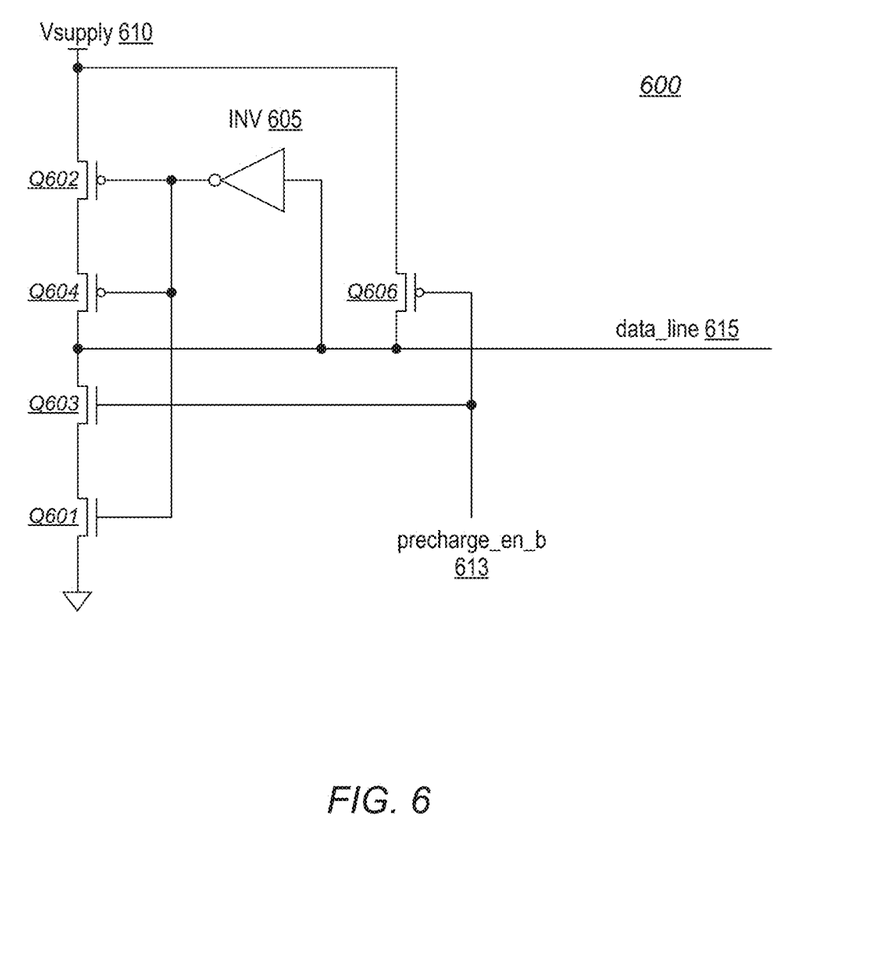
FIG. 6 illustrates an embodiment of a data line keeper circuit.

Moving to FIG. 6 an embodiment of a keeper circuit is illustrated. Keeper circuit 600 may, in some embodiments, correspond to one of multiple keeper circuits in keeper 405L or 405R in FIG. 4. Keeper circuit 600 includes transistor Q601 coupled to transistor Q603 and inverter (INV) 605, and transistor Q602 coupled to transistors Q604 and Q606 and INV 605. Keeper circuit 600 receives precharge_en_b 613 and Vsupply 610. Keeper circuit 600 may be coupled to data_line 615 and may be used to pre-charge and then latch a value of a selected memory cell enabled on data_line 615. Keeper circuit 600 may be capable of maintaining a latched value until precharge_en_b 613 is asserted.

Control circuitry, such as, e.g., control circuitry 403 in FIG. 4, may assert a pre-charge enable signal, i.e., precharge_en_b 613, to prepare data_line 615 for a read operation in response to receiving a read command. In response to precharge_en_b 613 asserting, Q606 may turn on, opening a path from data_line 615 to Vsupply 610, thereby pre-charging data_line 615 to a high level. In FIG. 6, precharge_en_b 613 is shown to be an active low signal, i.e., pre-charging of data_line 615 may occur when precharge_en_b 613 is at a logic low. In other embodiments, however, keeper circuit 600 may be designed such that the received pre-charge enable signal is an active high signal.

Precharge_en_b 613 may be de-asserted once data_line 615 has been pre-charged. In some embodiments, the de-assertion of precharge_en_b 613 may be in response to a transition of a clock signal, such as, for example, clock signal 430. The de-assertion of precharge_en_b 613 may turn Q606 off, closing the path to Vsupply 610 and turn Q603 on, opening a path from data_line 615 to Q601. Since data_line 615 has been pre-charged high, INV 605 may drive a low level onto Q602, Q604 and Q601, turning Q601 off, and turning Q602 and Q604 on. Q602 and Q604 may open a path to Vsupply 610, which may continue to pull data_line 615 to a high level. If a selected memory cell currently coupled to keeper circuit 600 stores a high level, then keeper circuit 600 may maintain, or latch, the high level on data_line 615. If, however, the selected memory cell is storing a low level, then the low level of the memory cell may override the path to Vsupply through Q602 and Q604 and pull data_line 615 to a low level, thereby causing INV 605 to output a high level, which may then turn Q602 and Q604 off, and turn Q601 on, opening a path to the ground reference and latching a low level on data_line 615.

The latched value on data_line 615 may be maintained until a next assertion of precharge_en_b 613. As described in regards to FIG. 5, precharge_en_b 613 may not be asserted again until a new read command is received in which a decoded address included in the read command identifies a different memory page than identified by the most recently executed read command.

It is noted that the keeper circuit illustrated in FIG. 6 is merely an example. Other embodiments may include additional transistors and/or signals, as well as different configurations of transistors. Operation of the circuit of FIG. 6 may also differ from the description due to differences in technology and fabrication of the circuits in other embodiments.

Figure 7:
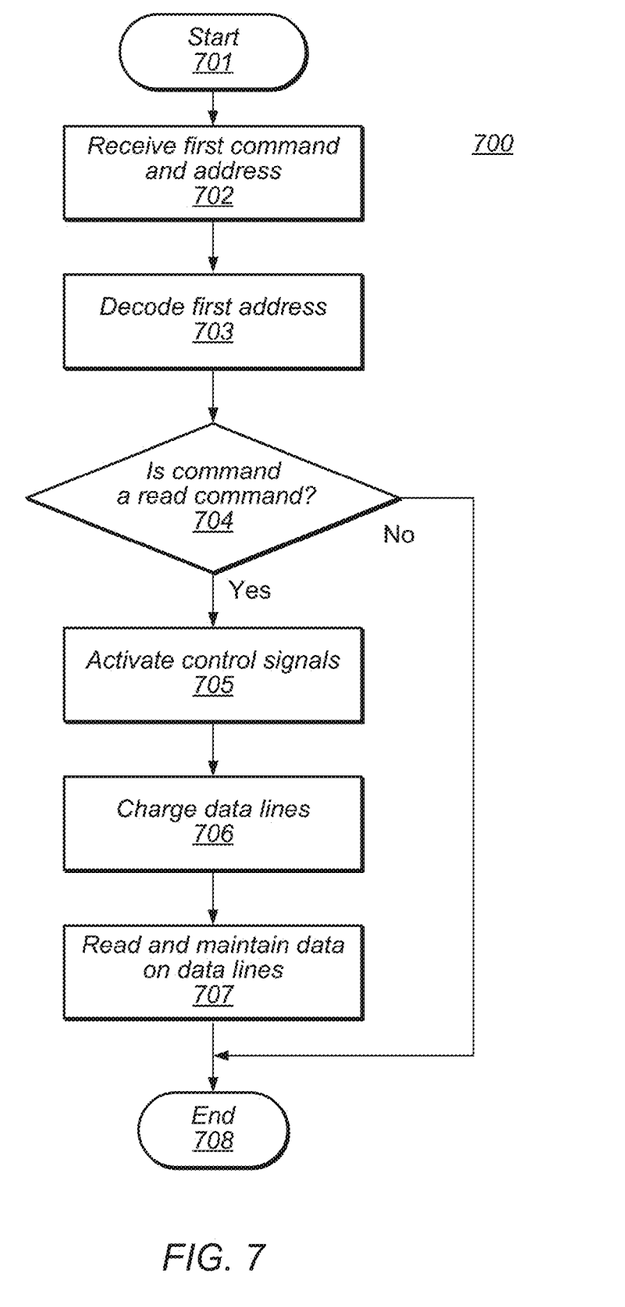
FIG. 7 illustrates a flowchart for an embodiment of a method for operating a memory.

Turning to FIG. 7, a flowchart for an embodiment of a method for operating a memory is illustrated. Method 700 of FIG. 7 may be applied to memory 400 of FIG. 4. Referring collectively to FIG. 4 and the flowchart of FIG. 7, method 700 may begin in block 701.

A first command may be received, including an address (block 702). The command may be received from a processor within an SoC such as, for example, SoC 100 and may be received by control circuitry 403. The first command may include a memory operation to be performed on memory 400.

The address may be decoded (block 703). Address decoding logic in control circuitry 403 may decode the received address. Once decoded, a memory bank or memory array may be determined. A page of memory cells or subset of memory cells in a page within the determined memory bank may be selected. The decoded address may not correspond to a same memory bank or page as a most recent command.

Method 700 may depend on the type of command received (block 704). If the command is not a read command, then method 700 may end in block 708. If the command is determined to be a read command, such as read command 412a, then method 700 may move to block 705 to begin a read operation.

Control circuitry 403 may assert one or more control signals (block 705). Asserted control signals may include precharge_L 421 and precharge_R 423. Row select 416 may receive a value corresponding to the selected page. In other embodiments, row select 416 may include a number of control lines, each line corresponding to one row of the memory banks. In such an embodiment, the row select line corresponding to one or more rows included in the selected page may be asserted.

Data_lines_L 417 and data_lines_R 419 may be pre-charged (block 706). In response to the assertion of precharge_L 421 and precharge_R 423, keeper circuits 405L and 405R may pre-charge data_lines_L 417 and data_lines_R 419 in preparation for reading memory cells in the selected page. This pre-charging operation may overwrite any data that may have been maintained on data_lines_L 417 and data_lines_R 419 from a previous read command.

Memory cells in the selected page may be read (block 707). After data_lines_L 417 and data_lines_R 419 have been pre-charged, control circuitry 403 may de-assert precharge_L 421 and precharge_R 423 and initiate reading of the selected memory cells. Keeper circuits 405L and 405R may latch the values stored in the selected cells and maintain these values until a next pre-charging operation. Method 700 may end in block 708.

It is noted that the method of FIG. 7 is merely an example. In other embodiments, different operations and different orders of operations are possible and contemplated.

Figure 8:
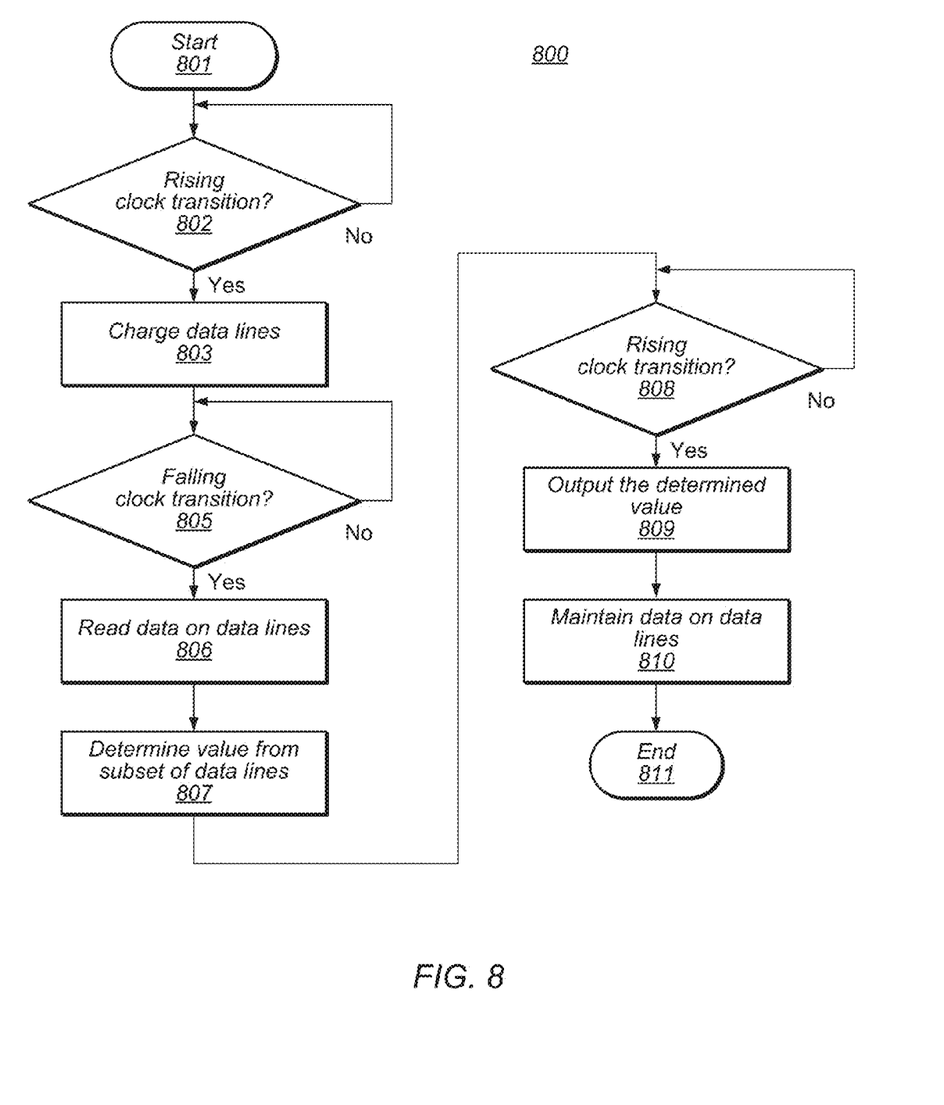
FIG. 8 illustrates a flowchart for an embodiment of a method for reading data from a memory.

Moving now to FIG. 8, a flowchart for an embodiment of a method for reading data from a memory is illustrated. Method 800 of FIG. 8 may be applied to memory 400 of FIG. 4. Referring collectively to FIG. 4 and the flowchart of FIG. 8, method 800 may begin in block 801 after memory 400 has determined a read command, such as read command 412a, has been received.

Method 800 may depend on a clock signal, such as, e.g., clock signal 430 (block 802). Control circuitry 403 may determine if a rising clock transition occurs on clock signal 430. It is noted that a "clock transition," as referred to herein (which may also be referred to as a clock edge in some embodiments) may refer to a clock signal changing from a first logic value to a second logic value. A clock transition may be "rising" if the clock signal goes from a logic 0 value to a logic 1 value, and "falling" if the clock signal goes from a logic 1 to a logic 0. If a rising transition is detected on clock signal 430, then method 800 may continue execution of read command 412a in block 803. Otherwise, method 800 may remain in block 802 until a rising transition is detected. In other embodiments, control circuitry 403 may be designed to detect a falling transition rather than a rising transition in block 802.

Data_lines_L 417 and data_lines_R 419 may be pre-charged (block 803). In response to detecting the rising transition on clock signal 430, control circuitry 403 may assert control signals precharge_L 421 and precharge_R 423. Control circuitry 403 may also decode an address and then assert row select 416 accordingly. In response to the assertion of precharge_L 421 and precharge_R 423 keeper circuits 405L and 405R may pre-charge data_lines_L 417 and data_lines_R 419, respectively.

Method 800 may again depend on clock signal 430 (block 805). Control circuitry 403 may determine if a falling transition occurs on clock signal 430. In other embodiments, control circuitry 403 may detect a rising transition rather than a falling transition in block 805. If a falling transition is detected, then method 800 may continue execution of read command 412a in block 806. Otherwise, method 800 may remain in block 805 until a falling transition is detected.

Data from memory cells selected by the decoded address may be read onto data_lines_L 417 and data_lines_R 419 (block 806). In response to the falling transition on clock signal 430, control circuitry 403 may de-assert precharge_L 421 and precharge_R 423 and initiate reading of the selected memory cells. Data from the selected memory cells may be latched by keeper circuits 405L and 405R onto data_lines_L 417 and data_lines_R 419, respectively.

Data output 411 may be determined from a subset of data latched on data_lines_L 417 and data_lines_R 419 (block 807). MUX 407 may receive signals to determine from which data lines of data_lines_L 417 and data_lines_R 419 to select to retrieve data values for generating data output 411. Data output 411 may be a single data value composed of multiple bits of data from data_lines_L 417 and data_lines_R 419. In other embodiments, data output 411 may include several data values comprised of bit values from several subsets of the data lines, as illustrated in FIG. 3 and FIG. 5. The signals used to determine which data_lines of data_lines_L 417 and data_lines_R 419 to select may be received from control circuitry 403, dependent on the decoded address. In other embodiments, the signals may be received from a processor that initiated read command 412a.

Method 800 may once again depend on clock signal 430 (block 808). Another rising transition on clock signal 430 may be detected by control circuitry 403. In some embodiments, control circuitry 403 may detect a falling transition rather than a rising transition in block 808. In other embodiments, control circuitry 403 may detect rising transitions in blocks 802, 805 and 808, while in still other embodiments, falling transitions may be detected in all three blocks. In the current embodiment, if a rising transition is detected, then method 800 may continue execution of read command 412a in block 809. Otherwise, method 800 may remain in block 808 until a rising transition is detected.

MUX 407 may output the determined value of data output 411 (block 809). MUX 407 may drive data output 411 onto a system bus or other data bus for a processor to receive. In other embodiments, data output 411 may be stored in an output data register of memory 400.

Data_lines_L 417 and data_lines_R 419 may retain the read data values after data output has been received by a processor or stored in a register (block 810). Instead of pre-charging data_lines_L 417 and data_lines_R 419 for a next read command, the data values from the read command 412a may be maintained on the data lines. If a next read command, such as, for example, read command 412b, includes an address referencing the same memory page, then the retained data may be reused.

It is noted that method 800 represented in FIG. 8 is merely an example for presenting the concepts disclosed herein. In other embodiments, a different number of blocks may be included. Blocks may also be performed in a different order than illustrated.

Figure 9:
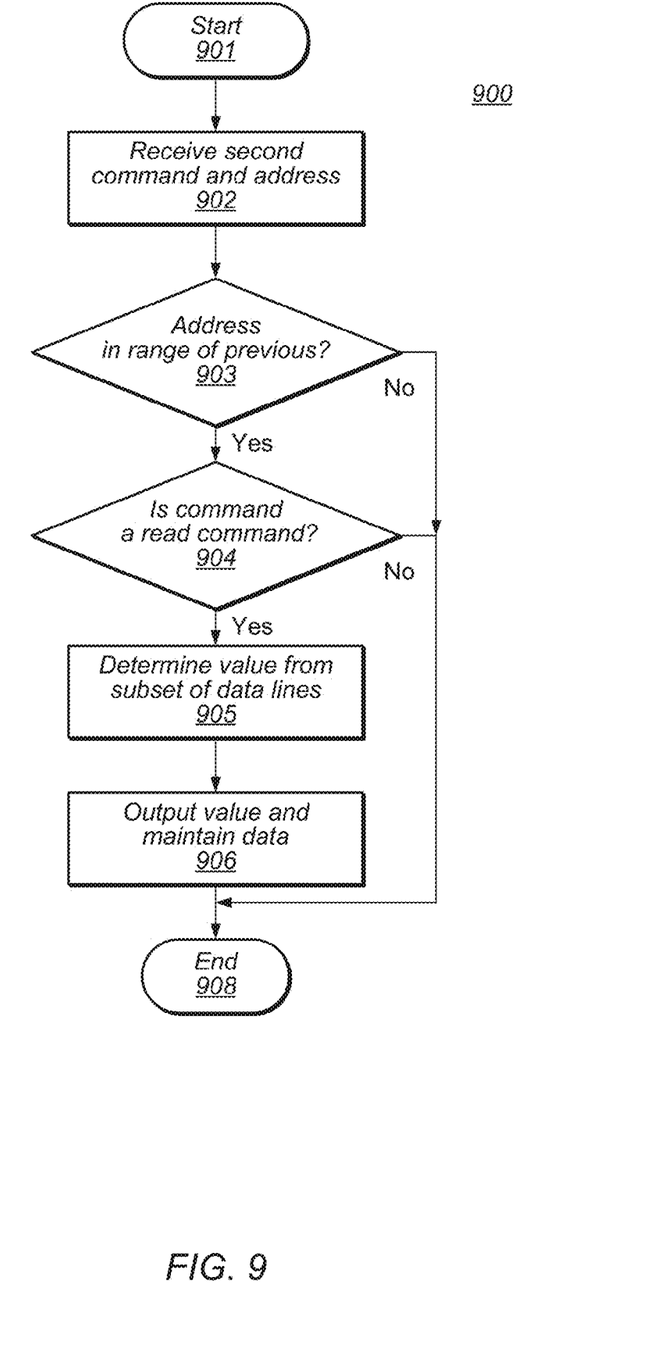
FIG. 9 illustrates a flowchart for an embodiment of a method for selecting data from a plurality of data lines.

Turning now to FIG. 9, a flowchart for an embodiment of a method for selecting data from a plurality of data lines in a memory is illustrated. Method 900 of FIG. 9 may be applied to memory 400 of FIG. 4. Referring collectively to FIG. 4 and the flowchart of FIG. 9, method 900 may begin in block 901 after memory 400 has executed a first read command, such as, e.g., read command 412a.

Control circuitry 403 may receive a second command (block 902). The second command may include an address which may also be decoded in block 902. The second command may be received upon completion of read command 412a, or in other embodiments, may be received some amount of time after completing read command 412a. In some embodiments, control circuitry may include a command queue and may receive and store the second command before read command 412a has been completed.

Method 900 may depend on the decoded address from the second command (block 903). Control circuitry 403 may determine if the address from the second command, decoded in block 902, corresponds to a same memory page as the address from read command 412a. If the addresses correspond to the same memory page, then method 900 may move to block 904 to determine a command type for the second command. Otherwise, the method may end in block 908, and another method, such as method 700 or method 800 from FIGS. 7 and 8, respectively, may be executed to complete the second command.

Method 900 may depend on a command type for the second command (block 904). Control circuitry 403 may determine if the second command is a read command. If control circuitry 403 determines that the second command is a read command, such as, for example, read command 412b, then the method may move to block 905 to continue execution of read command 412b. Otherwise, if the second command is a different type of command, then method 900 may end in block 908 and begin execution of another method for completing the second command.

MUX 407 may receive selection signals to identify a subset of data_lines_L 417 and data_lines_R 419 for determining a value for data output 411 (block 905). Since the address of read command 412b has been determined to access a same memory page as previously executed read command 412a, control circuitry 403 may not assert precharge_L 421 and precharge_R 423, allowing data_lines_L 417 and data_lines_R 419 to retain the data values read in response to read command 412a. The address of read command 412b may access a different subset of data_lines_L 417 and data_lines_R 419 than the address of read command 412a. Control circuitry 403 may generate a value for the selection signals dependent on the address of read command 412b and send this value to MUX 407 to select the corresponding data lines. In other embodiments, the address from read command 412b may not include information on which data lines to select, and a value for the selection signals may come from another source, such as, for example, a processor that initiated read command 412b.

MUX 407 may generate a value for data output 411 (block 906). Based on the selected data lines from data_lines_L 417 and data_lines_R 419, MUX 407 may compose data output 411. As previously described in regards to block 807 of FIG. 8, data output 411 may be a single data word composed of multiple bits of data from data_lines_L 417 and data_lines_R 419. In other embodiments, data output 411 may include several data values comprised of bit values from several subsets of the data lines, as illustrated in FIG. 3 and FIG. 5. Also as previously described in regards to FIG. 8, MUX 407 may drive data output 411 onto a data bus for a processor to receive, or, in other embodiments, data output 411 may be stored in an output data register of memory 400. Data_lines_L 417 and data_lines_R 419 may retain the data values read in response to read command 412a and reused in response to read command 412b. The method may end in block 908.

It is noted that method 900 illustrated in FIG. 9 is merely an example. In other embodiments, blocks may also be performed in a different order than as illustrated. In some embodiments, a different number of blocks may be included.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a memory, wherein the memory includes a plurality of pages;
   circuitry configured to receive a first read command and a first address, wherein the first address corresponds to a given page of the plurality of pages;
   a plurality of pre-charge circuits, wherein each pre-charge circuit of the plurality of pre-charge circuits is configured to charge a respective data line of a plurality of data lines to a predetermined voltage level, dependent upon the first address;
   wherein the circuitry is further configured to:
      read data values from the given page of the memory; and
      transfer the data values to the plurality of data lines;
   wherein the plurality of pre-charge circuits are further configured to maintain the data on the plurality of data lines; and
   wherein the circuitry is further configured to:
      select, for output, a first subset of the maintained data;
      receive a second read command and a second address; and
      select, for output, a second subset of the maintained data responsive to a determination that the second address corresponds to the given page of the plurality of pages, wherein the first subset and the second subset are different.

2. The apparatus of claim 1, wherein each pre-charge circuit of the plurality of pre-charge circuits is configured to charge the respective data line of the plurality of data lines responsive to a first clock transition of a received clock signal.

3. The apparatus of claim 2, wherein the circuitry is further configured to transfer the data values to the plurality of data lines responsive to a second clock transition of the received clock signal.

4. The apparatus of claim 1, wherein the circuitry includes a multiplex unit, and wherein the multiplex unit is configured to generate a first output value dependent upon the first subset of the maintained data.

5. The apparatus of claim 4, wherein the multiplex unit is further configured to generate a second output value dependent upon the second subset of the maintained data.

6. The apparatus of claim 1, wherein the first subset and the second subset of the maintained data are selected dependent upon an output of a branch prediction unit.

7. The apparatus of claim 6, wherein each pre-charge circuit of the plurality of pre-charge circuits is further configured to charge the respective data line of the plurality of data lines responsive to an activation of a plurality of charge enable signals dependent upon the first address, and wherein the circuitry is further configured to transfer the data values to the plurality of data lines responsive to an activation of a plurality of read enable signals.

8. A method, comprising:
receiving a first read command and a first address by a memory, wherein the memory includes a plurality of pages, and wherein the first address corresponds to a given page of the plurality of pages;
charging each data line of a plurality of data lines to a predetermined voltage level, wherein each data line of the plurality of data lines is coupled to a respective output port of a plurality of output ports of the memory;
reading data values from the memory array;
transferring the data to the plurality of data lines;
maintaining the data on the plurality of data lines;
selecting, for output, a first subset of the maintained data;
receiving a second read command and a second address by the memory; and
selecting, for output, a second subset of the maintained data responsive to a determination that the second address corresponds to the given page of the plurality of pages, wherein the second subset is different than the first subset.

9. The method of claim 8, further comprising charging each data line of the plurality of data lines responsive to a first clock transition of a received clock signal.

10. The method of claim 9, further comprising transferring the data to the plurality of data lines responsive to a second clock transition of the received clock signal.

11. The method of claim 8, further comprising generating a first output value for the first read operation dependent upon the first subset of the maintained data.

12. The method of claim 11, further comprising generating a second output value for the second read operation dependent upon the second subset of the maintained data.

13. The method of claim 12, wherein the first subset and second subset of the maintained data are selected dependent upon an output of a branch prediction unit.

14. The method of claim 13, further comprising:
charging each data line of the plurality of data lines responsive to activating a plurality of charge enable signals dependent upon the first address; and
transferring the data to the plurality of data lines responsive to activating a plurality of read enable signals.

15. A system, comprising:
a processor; and
a memory including a plurality of pages, wherein the memory is configured to:
receive a first address from the processor, wherein the first address corresponds to a given page of the plurality of pages;
read data from the given page of the plurality of pages, wherein the data includes a plurality of data bits;
charge each data line of a plurality of data lines to a predetermined voltage level;
transfer each data bit of the plurality of data bits to a respective data line of the plurality of data lines;
maintain a data voltage level on each data line of the plurality of data lines, wherein the data voltage level corresponds to a value of a respective data bit;
select, for output to the processor, a first subset of the plurality of data bits;
receive a second address from the processor; and
select, for output to the processor, a second subset of the plurality of data bits responsive to a determination that the second address corresponds to the given page of the plurality of pages, wherein the second subset is different from the first subset.

16. The system of claim 15, wherein the memory is further configured to charge each data line of the plurality of data lines to the predetermined voltage level responsive to a first clock transition of a received clock signal.

17. The system of claim 16, wherein the memory is further configured to transfer each data bit of the plurality of data bits to the respective data line of the plurality of data lines responsive to a second clock transition of the received clock signal.

18. The system of claim 15, wherein the memory is further configured to charge each data line of the plurality of data lines to a predetermined voltage level responsive to an activation of a plurality of charge enable signals dependent upon the first address.

19. The system of claim 18, wherein the memory is further configured to transfer each data bit of the plurality of data bits to the respective data line of the plurality of data lines responsive to an activation of a plurality of read enable signals.

20. The system of claim 15, wherein the processor includes a branch prediction unit and wherein the first subset and the second subset of the plurality of data bits are selected dependent upon an output of the branch prediction unit.

\* \* \* \* \*